United States Patent [19]
Larsson

[11] Patent Number: 6,160,860
[45] Date of Patent: Dec. 12, 2000

[54] PHASE-LOCKED LOOP (PLL) CIRCUIT CONTAINING A FREQUENCY DETECTOR FOR IMPROVED FREQUENCY ACQUISITION

[75] Inventor: Patrik Larsson, Matawan, N.J.

[73] Assignee: Lucent Technologies Inc., Murray Hill, N.J.

[21] Appl. No.: 09/014,418

[22] Filed: Jan. 28, 1998

[51] Int. Cl.[7] .............................. H03D 3/24; H03D 3/18; H03D 3/02; H03L 7/06
[52] U.S. Cl. ......................... 375/376; 375/327; 327/147; 329/325
[58] Field of Search ..................... 375/376, 360, 375/294, 355, 371, 373, 327; 327/147, 156; 329/325

[56] References Cited

U.S. PATENT DOCUMENTS

| | | | |
|---|---|---|---|
| 5,299,237 | 3/1994 | Head ........................................ | 375/376 |
| 5,809,207 | 9/1998 | Miyagi et al. ............................ | 386/116 |
| 5,835,542 | 11/1998 | Lu ............................................ | 375/359 |
| 5,943,378 | 8/1999 | Keba et al. ............................... | 375/373 |

OTHER PUBLICATIONS

T.H. Hu, P.R. Gray, "A Monolithic 480 Mb/s Parallel AGC/Decision/Clock–Recovery Circuit in 1.2–$\mu$m CMOS," I.E.E.E. J. of Solid–State Circuits, vol. 28, No. 12, 1314–20 (1993).

J.D.H. Alexander, "Clock Recovery From Random Binary Signals," Electr. Lett., vol. 11, No. 22, 541–42 (Oct. 1975).

*Primary Examiner*—Chi H. Pham
*Assistant Examiner*—Khai Tran
*Attorney, Agent, or Firm*—Ryan, Mason & Lewis, LLP

[57] ABSTRACT

An extended frequency lock range is achieved in a phase-locked loop (PLL) circuit based on sampled phase detectors by introducing frequency feedback into the PLL circuit. At least one data sampler samples adjacent bits of incoming data, such as data bits $D_X$ and $D_Y$, and an edge detector samples an edge, E, of the incoming data signal between the two data bits, $D_X$ and $D_Y$. Sequence values "101" or "010" for the data bits $D_X$, E and $D_Y$, are not valid and indicate that the VCO is sampling the incoming data stream too slowly. When sequence values of "101" or "010" are measured by the sampled phase detectors, the frequency of the VCO output, $V_O$, is known to be too low, and a constant current is preferably injected by the sampled phase detector into the PLL, until the frequency becomes too high, upon which a constant current of opposite polarity is applied. A PLL circuit having a frequency detector in combination with a biased phase detector is also disclosed, to ensure that the PLL can be locked. A biased phase detector applies more phase error correction in one direction than in the other direction. For example, a positive biased phase detector applies more positive current, $I_{UP}$, over time than negative current, $I_{DOWN}$. The VCO control voltage is initialized to a value below the lock-in voltage for a positive biased phase detector embodiment, and the positive biased phase detector will cause a steady increase in the VCO control voltage until the PLL locks, thereby causing the phase error to be approximately zero.

32 Claims, 5 Drawing Sheets

PHASE-LOCKED LOOP (PLL) CIRCUIT CONTAINING A FREQUENCY DETECTOR FOR IMPROVED FREQUENCY ACQUISITION

CROSS-REFERENCE TO RELATED APPLICATIONS

The present invention is related to the following United States Patent Applications filed contemporaneously herewith: U.S Patent Application Ser. No. 09/014,861, entitled "A Phase-Locked Loop (PLL) Circuit Containing a Sampled Phase Detector With Reduced Jitter,", U.S Patent Application Ser. No. 09/015,014, entitled "A Phase-Locked Loop (PLL) Circuit Containing a Phase Detector For Achieving Byte Alignment," and U.S. Patent Application No. 09/015,035, entitled "A Phase-Locked Loop (PLL) Circuit Containing a Sampled Phase Detector With Improved Frequency Acquisition,", each assigned to the assignee of the present invention and incorporated by reference herein.

FIELD OF THE INVENTION

The present invention relates to phase-locked loop (PLL) circuits, and more particularly, to frequency acquisition techniques for circuits containing sampled phase detectors.

BACKGROUND OF THE INVENTION

Phase-locked loop (PLL) circuits are frequently utilized to lock an oscillator in phase with a reference signal. PLL circuits are often utilized within receivers in digital communication systems to generate a local clock signal that is phase aligned with an incoming reference signal. The phase aligned local clock signal facilitates the receipt and processing of synchronous data sent by a transmitter in the communication system.

A conventional PLL circuit includes a phase detector, a filter and a voltage-controlled oscillator (VCO). In the conventional PLL circuit, the phase detector compares the incoming reference signal and the output of the VCO. The phase detector generates an error signal that is representative of the phase difference of the reference signal and the VCO output. The error signal is filtered and applied to the control input of the VCO to produce an output signal that tracks the phase of the reference signal.

A potential problem exists, however, for a PLL circuit based on sampled phase detectors. Specifically, for large frequency errors, conventional sampled phase detectors are equally likely to generate a positive or negative phase correction signal, regardless of the actual polarity of the frequency error, since the likelihood of sampling before and after a data edge (due to the frequency error) is fifty percent (50%) each. Thus, it is necessary to ensure that large frequency errors do not occur by extending the frequency lock range of the PLL circuit.

Conventional techniques for extending the frequency lock range of a PLL circuit based on sampled phase detectors utilize a square wave as an auxiliary input to initially tune the VCO, while using an additional phase and frequency detector (PFD) to compare the frequency of the auxiliary input to the VCO output. Once the VCO is tuned to the desired frequency in this manner, the additional phase and frequency detector (PFD) is switched out of the PLL feedback loop, and the sampled phase detector is utilized to phase lock onto the incoming data. Relying on the presence of an external reference signal, such as a square wave, to extend the frequency lock range, however, may not be practical in many receiver applications where the only received signal is the incoming random data.

SUMMARY OF THE INVENTION

A PLL circuit is disclosed that achieves an extended frequency lock range by introducing frequency feedback. A conventional PLL circuit, having a sampled phase detector, a filter and a voltage-controlled oscillator (VCO), is modified to include a frequency detector for determining when the frequency of the VCO output is too low. The PLL circuit has at least one data sampler for sampling two incoming data bits such as data bits $D_X$ and $D_Y$, and an edge detector for sampling the incoming data signal between the two data bits. If data bits $D_X$ and $D_Y$ have the same value, such that the value of $D_X D_Y$ is "11" or "00," then the value sampled by the edge detector, E, between the two data bits, $D_X$ and $D_Y$, should have the same value. If, however, the data bits $D_X$, E and $D_Y$, such that the value of $D_X E D_Y$ is "101" or "010," the sequence values are not valid. The sequence values "101" or "010" indicate that the VCO is sampling the incoming data stream too slowly.

According to one aspect of the invention, when the data bits $D_X$, E and $D_Y$, are measured such that the value of $D_X E D_Y$ is "101" or "010," the frequency of the VCO output, $V_O$, is known to be too low, and corrective measures are initiated. Specifically, the occurrence of a sequence "101" or "010" initiates the injection of a constant current by the sampled phase detector into the VCO, until another measured sequence ("000" or "111" when a transition is otherwise expected), indicates that the frequency is now too high, upon which a constant current of opposite polarity is applied.

Another aspect of the invention utilizes the frequency detector described above in combination with a biased phase detector, to ensure that the PLL can be locked. In one embodiment, a frequency detector initially switches the polarity of the current several times until the loop is close to being locked. Once the loop is as close to being locked as possible by the frequency detector, a positive bias phase detector pulls the VCO towards the pull-in range. As used herein, a biased phase detector applies more phase error correction in one direction than in the other direction. For example, a positive biased phase detector applies more positive current, $I_{UP}$, over time than negative current, $I_{DOWN}$.

When the frequency detector is combined with a positive biased phase detector, the frequency detector will bring the loop as close as possible to locking, and then the positive biased phase detector is applied to cause a steady increase in the VCO control voltage until the PLL locks, thereby causing the phase error to be approximately zero. In one implementation, a positive biased phase detector is achieved by suppressing the response for a predefined percentage of detected negative phase errors, while applying the same magnitude positive current, $I_{UP}$, and negative current, $I_{DOWN}$. For example, every second detected negative phase error can be ignored.

In a further variation, a PLL circuit contains a frequency detector in combination with a negative biased phase detector (injecting slightly more negative current over time than positive current). The frequency detector and negative biased phase detector are connected simultaneously. When the voltage is below the lock-in voltage, the frequency of the VCO output is too low, and the frequency detector injects positive current to increase the VCO voltage. When the voltage becomes too high, the negative biased phase detector takes over to lower the VCO voltage until the VCO locks.

DETAILED DESCRIPTION

Figure 1:
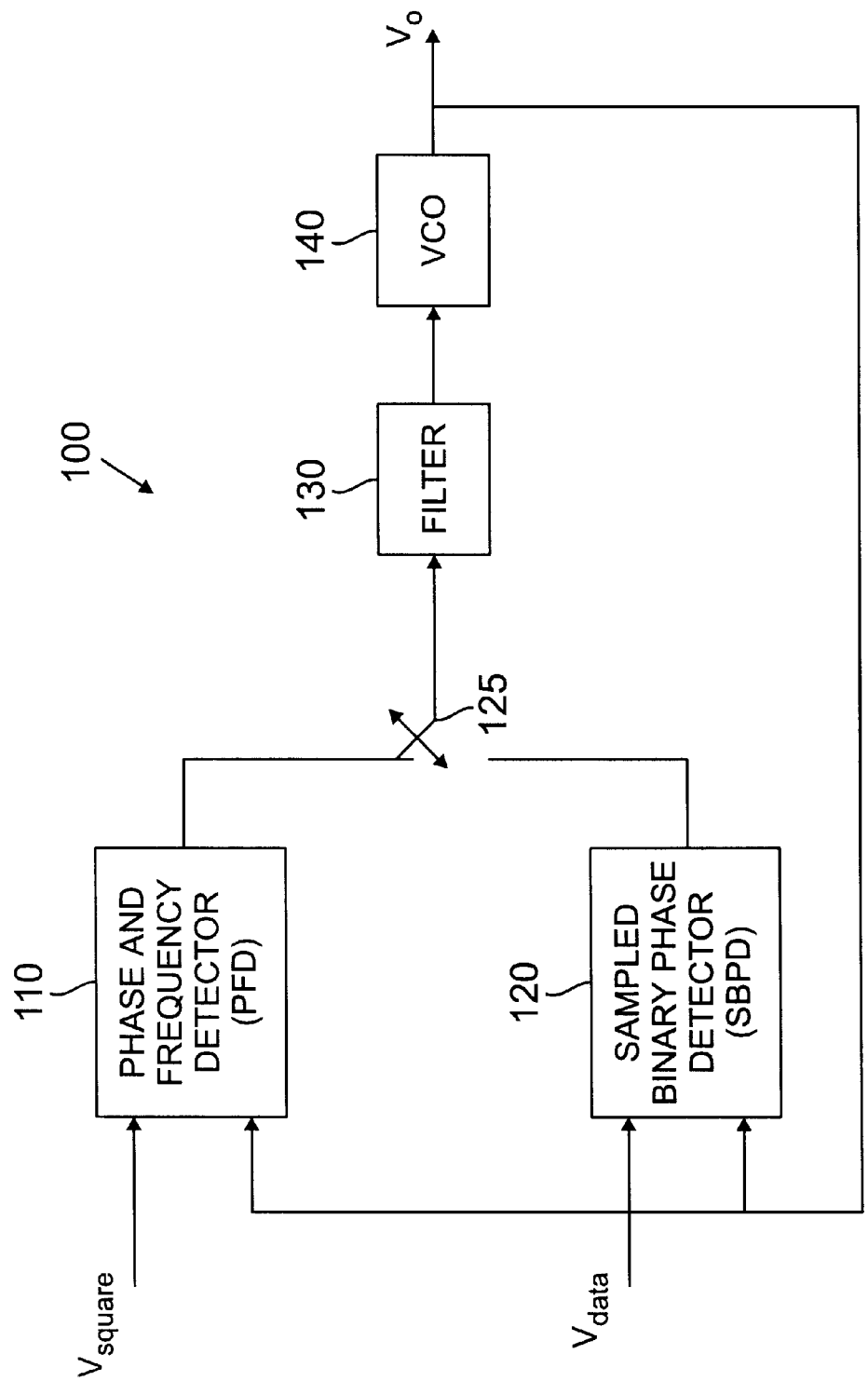
FIG. 1 is a schematic block diagram illustrating a conventional PLL circuit providing an extended frequency lock range.

FIG. 1 illustrates a conventional PLL circuit 100 providing an extended frequency lock range by utilizing a square wave as an auxiliary input to initially tune the voltage-controlled oscillator (VCO) 140, while using a phase and frequency detector (PFD) 110 to compare the frequency of the auxiliary input square wave to the VCO output, $V_O$. Once the VCO 140 is tuned to the frequency of the auxiliary input square wave, $V_{square}$, a switch 125 is activated to utilize a phase detector 120 to phase lock the VCO output, $V_O$, onto the incoming data.

Thus, the PLL circuit 100, shown in FIG. 1, includes a phase and frequency detector 110, a phase detector 120, a switch 125, a low pass filter 130 and a voltage-controlled oscillator (VCO) 140. Initially, the phase and frequency detector 110 compares the incoming auxiliary reference signal, $V_{square}$, and the output of the VCO, $V_O$. The phase and frequency detector 110 generates an error signal, $I_{err}$, representing the phase and frequency differences between the auxiliary reference signal, $V_{square}$, and the VCO output, $V_O$, until the VCO 140 is tuned to the frequency of the auxiliary input square wave, $V_{square}$. The error signal, $I_{err}$, produced by the phase and frequency detector 110 is filtered by the filter 130 and applied to the VCO 140 to produce an output signal, $V_O$, that tracks the phase and frequency of the signal, $V_{square}$. The VCO has a lock-in voltage defined to be the ideal voltage for which the PLL can lock without a cycle slip.

Thereafter, the phase detector 120 compares the incoming reference signal, $V_{data}$, and the output of the VCO, $V_O$. The phase detector 120 generates an error signal, $I_{err}$, representing the phase difference between the incoming data signal, $V_{data}$, and the VCO output, $V_O$. The error signal, $I_{err}$, produced by the phase detector 120 is filtered by the filter 130 and applied to the VCO 140 to produce an output signal, $V_O$, that tracks the phase of the signal, $V_{data}$.

Figure 2:
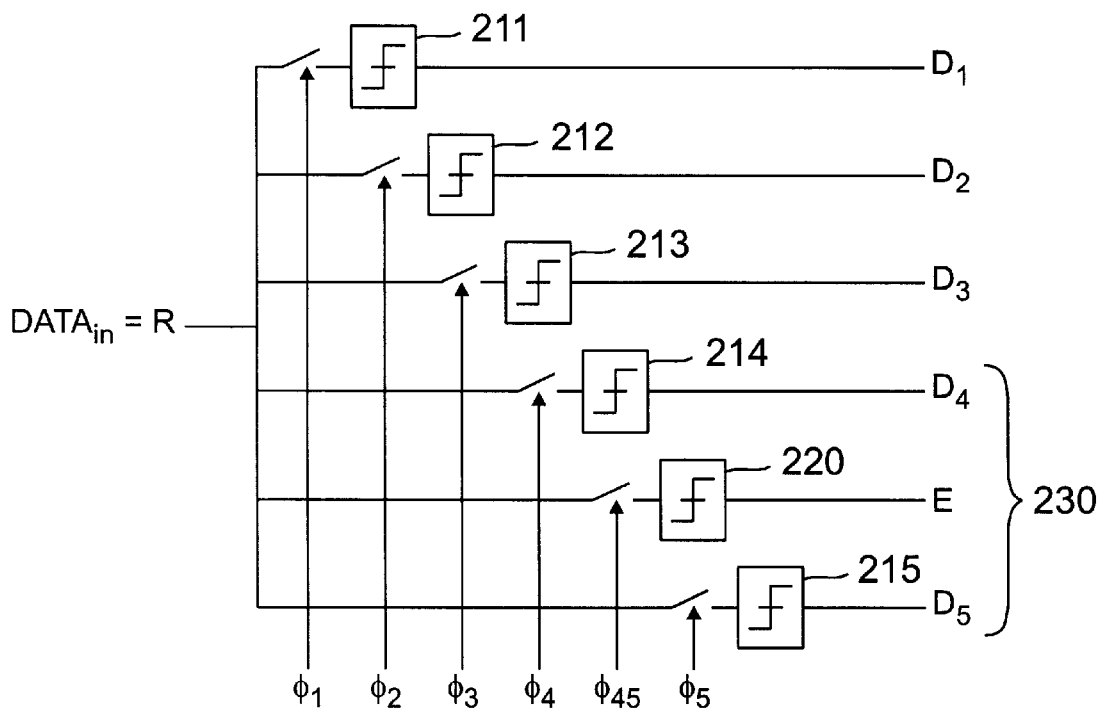
FIG. 2 is a schematic block diagram illustrating a conventional parallel data receiver circuit.
Figure 3:
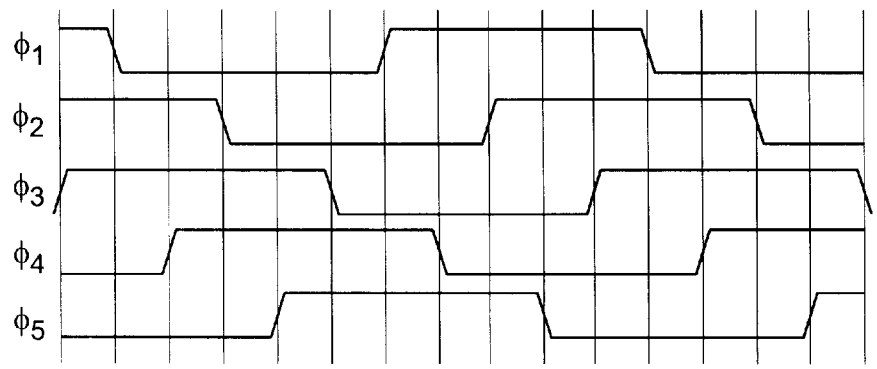
FIG. 3 the various clock cycles utilized to trigger each of the data samplers of FIG. 2.

FIG. 2 illustrates a conventional parallel data receiver circuit having five parallel data samplers 211–215 for sampling incoming data. As shown in FIG. 3, the clock phases, $\phi_1$–$\phi_5$, from the VCO output, $V_O$, are skewed by an amount equal to one-fifth of a clock cycle or period, and their rate is one-fifth of the rate of the incoming data. An edge detector 220, in cooperation with the two adjacent data samplers 214–215, operates as a phase detector 230, clocked by a clock phase, $\phi_{45}$, which is between $\phi_4$ and $\phi_5$. The edge detector 220 only observes every fifth data edge. The edge detector 220 can be embodied, for example, as a D-type flip flop or can be made decision directed so that it also works for the reference signal being a data signal.

Preferably, the edge detector 220 is triggered by the inverse of $\phi_2$, as shown in FIGS. 2 and 3. In this manner, the sampled phase detector 230 serves to align the VCO output, $V_O$, with the edge in between data bits $D_4$ and $D_5$. Thus, if there is a binary transition from high to low, for example, between data bits $D_4$ and $D_5$, the measurement of the edge detector 220 will be either high or low, indicating whether the sampling is being done just before or just after the falling edge, respectively. Likewise, if there is a binary transition from low to high between data bits $D_4$ and $D_5$, the measurement of the edge detector 220 will be either low or high, indicating whether the sampling is being done just before or just after the rising edge, respectively.

FREQUENCY ACQUISITION

Figure 4:
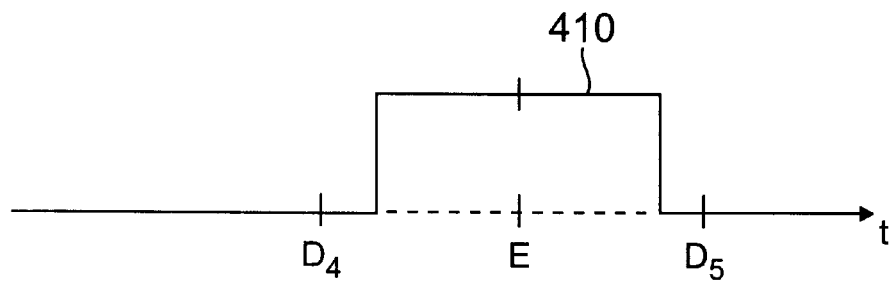
FIG. 4 illustrates a short data pulse, having the sequence value "010," indicating that the VCO output frequency is too low, relative to the incoming data frequency.

According to a feature of the present invention, an extended frequency lock range is achieved by introducing frequency feedback into the PLL circuit shown in FIG. 2. As previously indicated, the sampled phase detector 220 samples the incoming data stream between data bits $D_4$ and $D_5$. Thus, if data bits $D_4$ and $D_5$ have the same value, such as "11" or "00," then the edge detector 220 should have the same value. Thus, if the data bits $D_4$, E and $D_5$, as shown in FIG. 2, have the sequence values "101" or "010" the sequence values are not valid. It is noted that the sequence values "101" or "010" would be expected where there is a frequency difference between the incoming data stream and the VCO output, $V_O$. Specifically, the sequence values "101" or "010" indicate that the VCO is sampling the incoming data stream too slowly. As shown in FIG. 4, a short data pulse 410, having the sequence value "010" indicates that the VCO output frequency is too low, relative to the incoming data frequency.

In addition, if the incoming data stream was known to be a square wave, or if a transition between data bits $D_4$ and $D_5$ was otherwise expected, and the data bits $D_4$, E and $D_5$ have the sequence values "111" or "000," the sequence values are not valid. Specifically, the sequence values "111" or "000," when a transition is otherwise expected, indicates that the VCO is sampling the incoming data stream too quickly.

Thus, when the data bits $D_4$, E and $D_5$, are measured to have the sequence values "101" or "010," the frequency of the VCO output, $V_O$, is known to be too low, and corrective measures should be undertaken. In accordance with one feature of the present invention, the occurrence of one of the sequences, "101" or "010" preferably initiates the injection of a constant current by the sampled phase detector 220' into the PLL, until one of the other sequences ("000" or "111") is measured when a transition is otherwise expected, indicating that the frequency is now too high, upon which a constant current of opposite polarity is applied. The magnitude of the constant current is determined by the desired bandwidth to be achieved with the PLL. In this manner, the frequency of the VCO output, $V_O$, is changed over time, until the frequency gets too high, and then the direction of the current is reversed. In an alternate embodiment, a fixed charge is injected into the loop filter each time a frequency error is detected (for example, when the data bits $D_4$, E and $D_5$, are measured to have the sequence values "101" or "010").

Figure 6:
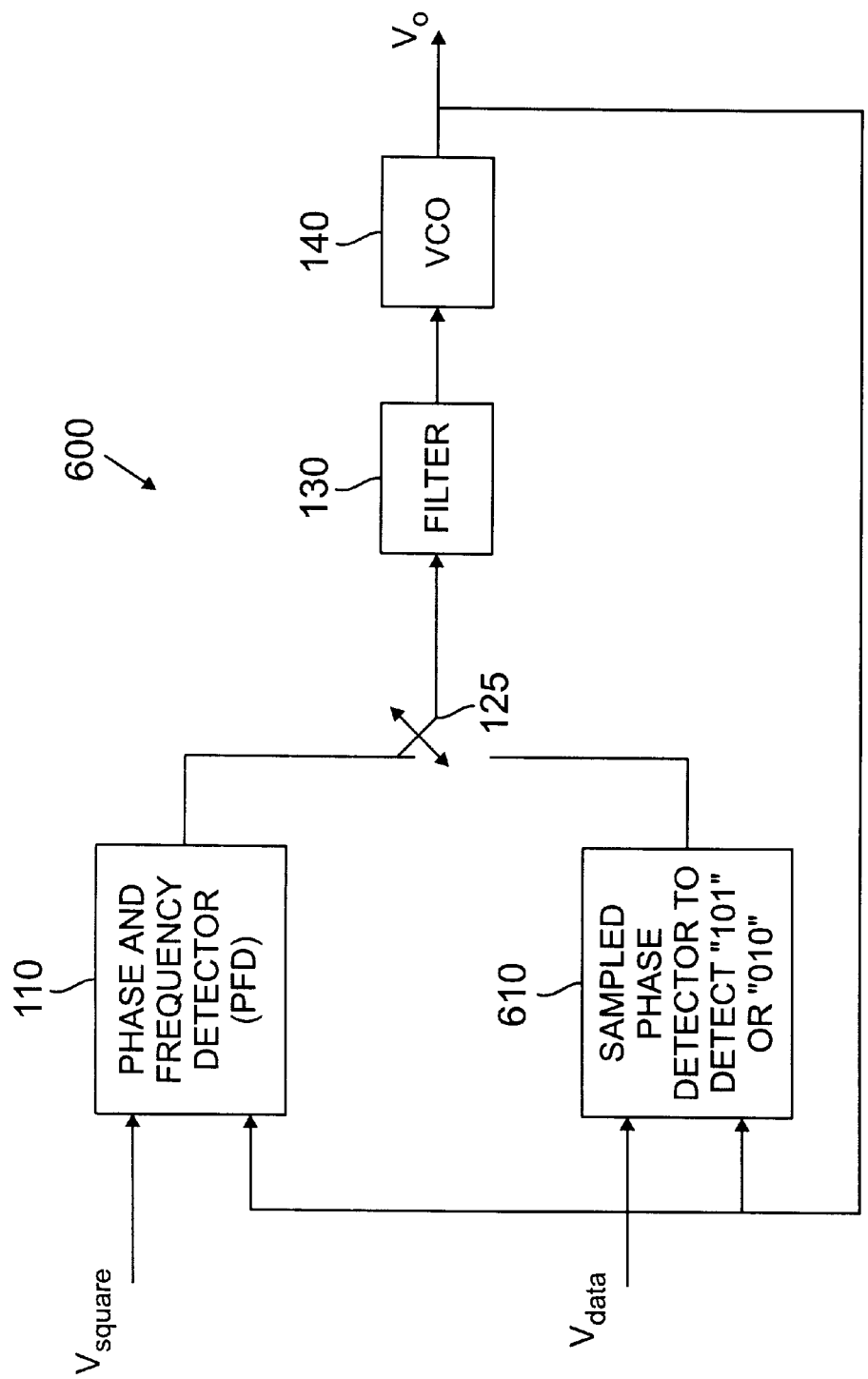
FIG. 6 illustrates a PLL circuit having a sampled phase detector in accordance with the present invention.

FIG. 6 illustrates a PLL circuit 600 having a sampled phase detector 610 in accordance with the present invention to detect when the measured sequence value produced by sampling adjacent data bits, $D_X$, and $D_Y$, and sampling the edge value, E, between the adjacent bits equals "101" or "010." The elements 110, 125, 130, 140 in the PLL circuit 600 of FIG. 6, may operate in the same manner as the like-numbered elements of FIG. 1.

FREQUENCY DETECTOR WITH BIASED PHASE DETECTOR

Figure 5:
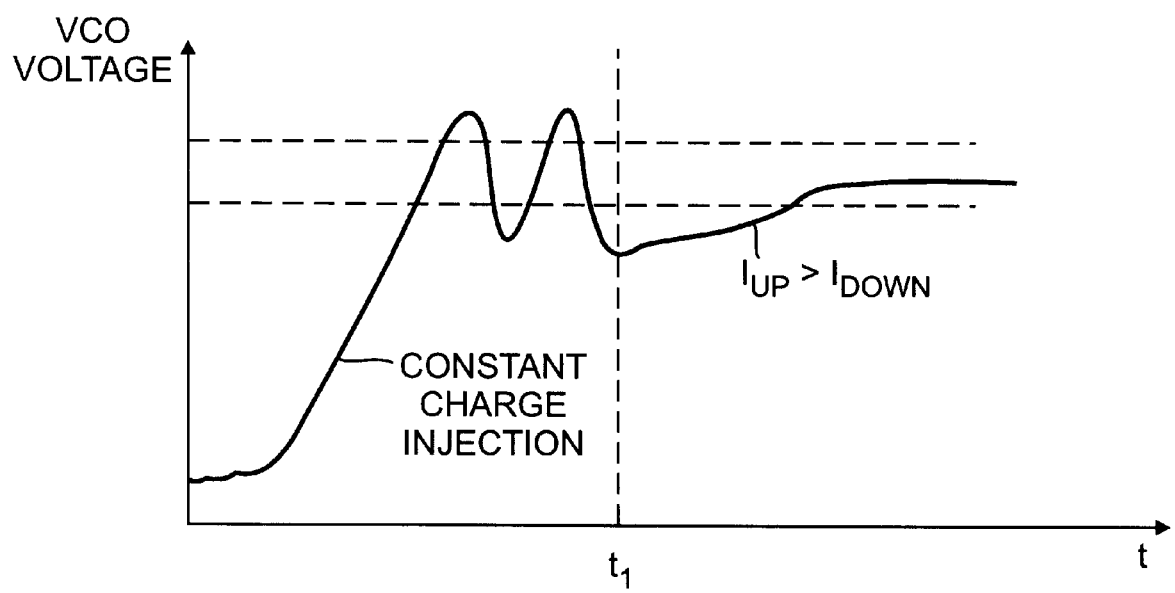
FIG. 5 illustrates the VCO control voltage produced by an integrated frequency detector/biased phase detector in accordance with an embodiment of the present invention until the PLL enters the pull-in range and locks.

Another embodiment of the invention that facilitates pull-in of the PLL is discussed in conjunction with FIG. 5. Typically, PLL circuits having a frequency detector, such as the embodiment described above in the section entitled FREQUENCY ACQUISITION, that exhibit a residual voltage error, that may oscillate the VCO control voltage outside of the pull-in range. By including a biased phase detector in the PLL circuit, such as the PLL circuit of FIG. 1, the PLL can be assured of locking. In one implementation, the frequency detector with constant charge injection, discussed above, initially switches the current several times until the loop is as close to being locked as possible by the frequency detector. Thereafter, at a time, $t_1$, a phase detector with positive bias is utilized to pull the VCO towards the pull-in range, as shown in FIG. 5.

As used herein, a biased phase detector applies more phase error correction in one direction than in the other direction. For example, a positive biased phase detector applies more positive current, $I_{UP}$, over time than negative current, $I_{DOWN}$. When the frequency detector is combined with a positive biased phase detector, the frequency detector will bring the loop as close as possible to locking, and then the positive biased phase detector is applied to cause a steady increase in the VCO control voltage until the PLL enters the pull-in range and locks.

In one implementation, a positive biased phase detector is achieved by suppressing the response for a predefined percentage of detected negative phase errors, while applying the same positive current, $I_{UP}$, and negative current, $I_{DOWN}$. For example, every second detected negative phase error could be ignored.

In an alternate embodiment, a PLL circuit contains a frequency detector and a negative biased phase detector (injecting slightly more negative current than positive current). The VCO can optionally be initialized to a voltage below the lock-in voltage. The frequency detector and negative biased phase detector are connected simultaneously. When the voltage is below the lock-in voltage, the frequency of the VCO output is too low, and the frequency detector injects positive current to increase the VCO voltage. When the voltage becomes too high, the negative biased phase detector takes over to lower the VCO voltage until the VCO locks.

Figure 7:
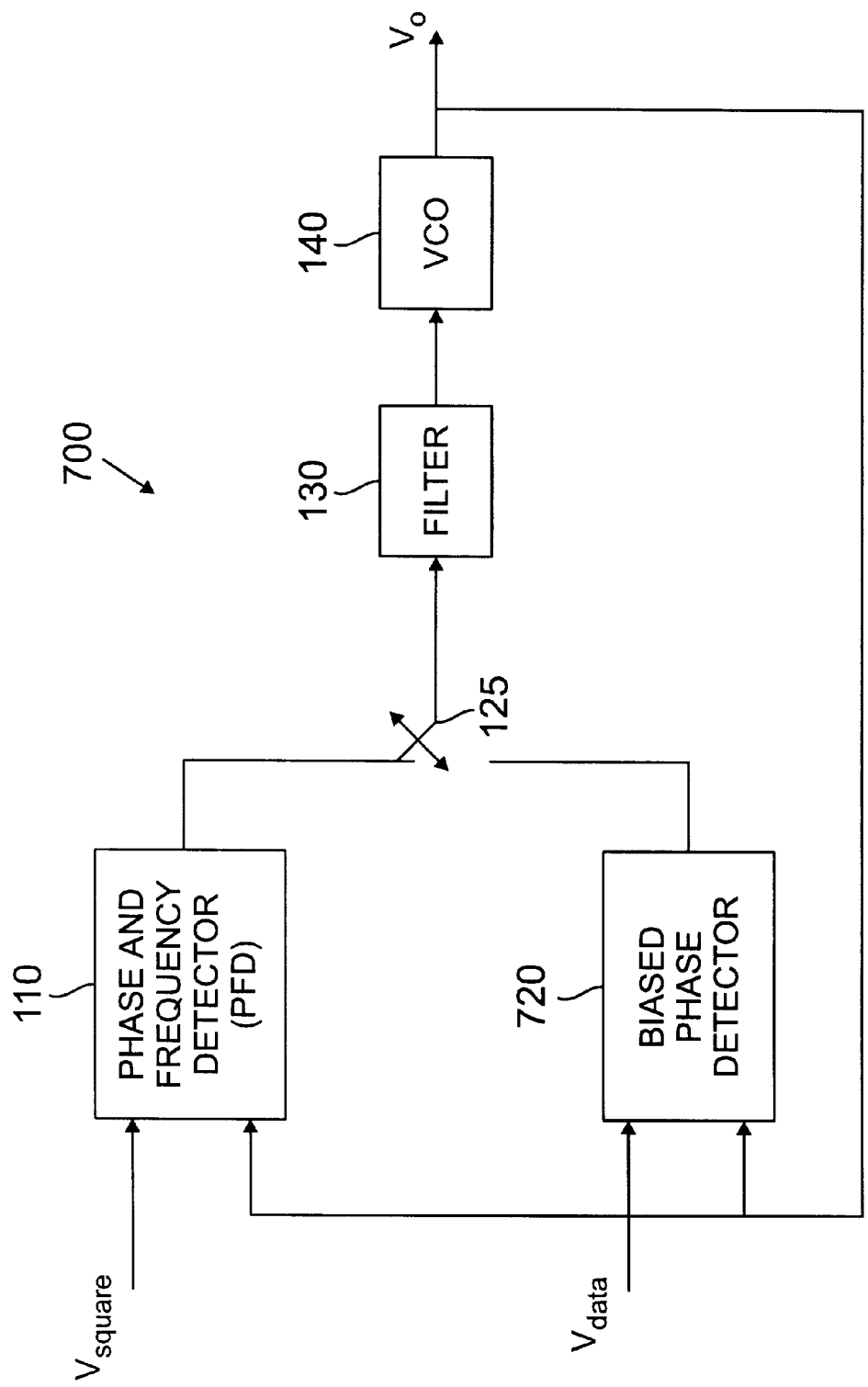
FIG. 7 illustrates a PLL circuit having a biased phase detector in accordance with another embodiment of the present invention.

FIG. 7 illustrates a PLL circuit 700 having a biased phase detector 720 in accordance with the present invention. The elements 110, 125, 130, 140 in the PLL circuit 700 of FIG. 7, may operate in the same manner as the like-numbered elements of FIG. 1.

It is to be understood that the embodiments and variations shown and described herein are merely illustrative of the principles of this invention and that various modifications may be implemented by those skilled in the art without departing from the scope and spirit of the invention.

I claim:

1. A phase-locked loop (PLL) circuit for generating an oscillator output signal, said oscillator output signal having a frequency, comprising:

at least one data sampler for sampling adjacent data bits, $D_X$ and $D_Y$, of an incoming data signal, said incoming data signal having a phase;

an edge detector for sampling an edge, E, of said incoming data signal between said two adjacent data bits, $D_X$ and $D_Y$;

current generating means for producing a first current when said sampled adjacent data bits, $D_X$ and $D_Y$, and said sampled edge value, E, between said adjacent bits produce a measured sequence value of binary "101" or "010," wherein said first current is produced until said measured sequence value indicates the frequency of said oscillator output signal becomes too high, upon which a second current of opposite polarity to said first current is produced;

a loop filter having an input and an output, the input being connected to said current generating means and the output producing a filtered current signal; and a governable oscillator having a control terminal and an output, the control terminal being connected to the filtered current signal and the oscillator output being the output of the loop, said oscillator output tracking the phase of the incoming data signal.

2. The phase-locked loop (PLL) circuit according to claim 1, wherein said governable oscillator is a voltage-controlled oscillator (VCO).

3. The phase-locked loop (PLL) circuit according to claim 1, wherein said loop filter is a low pass filter.

4. The phase-locked loop (PLL) circuit according to claim 1, wherein said at least one data samplers are D-type flip-flops.

5. The phase-locked loop (PLL) circuit according to claim 1, wherein said at least one data samplers and edge detector comprise a sampled phase detector that is decision directed.

6. The phase-locked loop (PLL) circuit according to claim 1, wherein said current is a constant current.

7. The phase-locked loop (PLL) circuit according to claim 1, wherein a measured sequence value of "000" or "111" indicates the frequency of said oscillator output signal is too high.

8. A method for locking the frequency of an oscillator output signal produced by a phase-locked loop (PLL) circuit, said oscillator output signal having a frequency, said method comprising the steps of:

sampling adjacent data bits of an incoming data signal, said incoming data signal having a phase;

sampling an edge of said incoming data signal between said two adjacent data bits;

generating a first current when said sampled adjacent data bits and said sampled edged value between said adjacent bits produce a measured sequence value of binary "101" or "010," wherein said first current is generated until said measured sequence value indicates the frequency of said oscillator output signal becomes too high, upon which a second current of opposite polarity is produced;

filtering said first and second currents; and applying said filtered current to a governable oscillator to generate said oscillator output signal, said oscillator output signal tracking the phase of the incoming data signal.

9. The method according to claim 8, wherein said sampling steps are performed by D-type flip-flops.

10. The method according to claim 8, wherein said sampling steps are performed by decision directed phase detectors.

11. The method according to claim 8, wherein said governable oscillator is a voltage-controlled oscillator (VCO).

12. A method for pulling in an oscillator output signal produced by a phase-locked loop (PLL) circuit, said oscillator output signal having a frequency, said method comprising the steps of:

generating a first error signal of alternating polarity current until said PLL is close to being locked;

comparing an input signal to said oscillator output signal, said input signal having a phase;

after a predefined number of clock cycles, generating a second error signal corresponding to the difference in phase of said input signal and said oscillator output signal, wherein said second error signal produces more positive current over time than negative current;

filtering said first and second error signals; and applying said filtered error signals to a governable oscillator, said oscillator output tracking the phase of the input signal.

13. The method according to claim 12, wherein said second error signal is generated after said predefined number of clock cycles by a sampled phase detector.

14. The method according to claim 12, wherein said second error signal consists of larger magnitude positive current than negative current.

15. The method according to claim 12, further comprising the step of suppressing said second error signal for one or more negative phase differences.

16. A method for locking a frequency of an oscillator output signal produced by a phase-locked loop (PLL) circuit, said method comprising the steps of:

sampling adjacent data bits of an incoming data signal, said incoming data signal having a phase;

sampling an edge of said incoming data signal between said two adjacent data bits;

generating a first current when said sampled adjacent data bits and said sampled edge value between said adjacent bits indicate that said sampling steps are being performed too slowly, wherein said first current is generated until said sampled adjacent data bits and said sampled edge value between said adjacent bits indicate the frequency of said oscillator output signal becomes too high, upon which a second current of opposite polarity to said first current is produced;

filtering said first and second currents; and applying said filtered current to a governable oscillator to generate said oscillator output signal, said oscillator output signal tracking the phase of the incoming data signal.

17. The method according to claim 16, wherein said sampling steps are performed by D-type flip-flops.

18. The method according to claim 16, wherein said sampling steps are performed by decision directed phase detectors.

19. The method according to claim 16, wherein said governable oscillator is a voltage-controlled oscillator (VCO).

20. A phase-locked loop (PLL) circuit for generating an oscillator output signal, said oscillator output signal having a frequency, comprising:

at least one data sampler for sampling two adjacent data bits, $D_X$ and $D_Y$, of an incoming data signal, said incoming data signal having a phase;

an edge detector for sampling an edge, E, of said incoming data signal between said two adjacent data bits;

current generating means for producing a first current when said sampled adjacent data bits, $D_X$ and $D_Y$, and said sampled edge value, E, between said adjacent bits produce a measured sequence value of binary "101" or "010," wherein said first current is produced until said measured sequence value indicates the frequency of said oscillator output signal becomes too high, upon which a second current of opposite polarity to said first current is produced; and a governable oscillator having a control terminal and an output, the control terminal being connected to said current generating means and the oscillator output being the output of the loop, said oscillator output tracking the phase of the incoming data signal.

21. The phase-locked loop (PLL) circuit according to claim 20, wherein said governable oscillator is a voltage-controlled oscillator (VCO).

22. The phase-locked loop (PLL) circuit according to claim 20, wherein said current produced by said current generating means is filtered.

23. The phase-locked loop (PLL) circuit according to claim 20, wherein said data samplers are D-type flip-flops.

24. The phase-locked loop (PLL) circuit according to claim 20, wherein said sampled phase detector is decision directed.

25. The phase-locked loop (PLL) circuit according to claim 20, wherein said current is a constant current.

26. The phase-locked loop (PLL) circuit according to claim 20, wherein a measured sequence value of "000" or "111" indicates the frequency of said oscillator output signal is too high.

27. A method for pulling in an oscillator output signal produced by a phase-locked loop (PLL) circuit, said oscillator output signal having a frequency, said method comprising the steps of:

generating a first error signal of alternating polarity current until said PLL is close to being locked;

comparing an input signal to said oscillator output signal, said input signal having a phase;

after a predefined number of clock cycles, generating a second error signal corresponding to the difference in phase of said input signal and said oscillator output signal, wherein said second error signal produces more negative current over time than positive current; and applying said first and second error signals to a governable oscillator, said oscillator output tracking the phase of the input signal.

28. The method according to claim 27, wherein said error signal is generated after said predefined number of clock cycles by a sampled phase detector.

29. The method according to claim 27, wherein said error signal generated after said predefined number of clock cycles consists of larger magnitude negative current than positive current.

30. The method according to claim 27, further comprising the step of suppressing said error signal after said predefined number of clock cycles for one or more of said positive phase differences.

31. A method for pulling in an oscillator output signal produced by a phase-locked loop (PLL) circuit, said oscillator output signal having a frequency, said method comprising the steps of:

generating a first error signal of alternating polarity current until said PLL is close to being locked;

comparing an input signal to said oscillator output signal, said input signal having a phase;

after a predefined number of clock cycles, generating a second error signal corresponding to the difference in phase of said input signal and said oscillator output signal, wherein said second error signal produces more control signals to increase said phase over time than to decrease said phase; and applying said first and second error signals to a governable oscillator, said oscillator output tracking the phase of the input signal.

32. A method for pulling in an oscillator output signal produced by a phase-locked loop (PLL) circuit, said oscillator output signal having a frequency, said method comprising the steps of:

generating a first error signal of alternating polarity current until said PLL is close to being locked;

comparing an input signal to said oscillator output signal, said input signal having a phase;

after a predefined number of clock cycles, generating a second error signal corresponding to the difference in phase of said input signal and said oscillator output signal, wherein said second error signal produces more control signals to decrease said phase over time than to increase said phase; and applying said first and second error signals to a governable oscillator, said oscillator output tracking the phase of the input signal.

* * * * *